(12) United States Patent
Sekigawa

(10) Patent No.: US 7,262,832 B2
(45) Date of Patent: Aug. 28, 2007

(54) EXPOSURE APPARATUS AND EXPOSURE METHOD FOR PERFORMING HIGH-SPEED AND EFFICIENT DIRECT EXPOSURE

(75) Inventor: Kazunari Sekigawa, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 11/259,810

(22) Filed: Oct. 26, 2005

(65) Prior Publication Data
US 2006/0091323 A1 May 4, 2006

(30) Foreign Application Priority Data
Oct. 28, 2004 (JP) ............... 2004-314040

(51) Int. Cl.
G03B 27/54 (2006.01)
G03B 27/42 (2006.01)
(52) U.S. Cl. .................................. 355/67; 355/52
(58) Field of Classification Search ............. 355/52, 355/53, 55, 67–69; 250/548; 356/399–401; 430/5, 20, 30
See application file for complete search history.

(56) References Cited

U.S. PATENT DOCUMENTS 5,999,244 A * 12/1999 Yanagihara et al. .......... 355/53
6,399,283 B1 * 6/2002 Hoshi .......................... 430/312
6,509,955 B2 * 1/2003 Mei et al. ..................... 355/53
6,800,421 B2 * 10/2004 Hasegawa et al. .......... 430/311
6,894,712 B2 5/2005 Ishikawa et al.
7,062,094 B2 * 6/2006 Zhou et al. .................. 382/232
7,094,506 B2 * 8/2006 Van Buel ...................... 430/5

FOREIGN PATENT DOCUMENTS

JP 10-112579 4/1998
JP 2004-1244 1/2004

* cited by examiner

Primary Examiner—Henry Hung Nguyen
(74) Attorney, Agent, or Firm—Morgan & Finnegan, LLP

(57) ABSTRACT

In an exposure apparatus, in which exposure data necessary for direct exposure is sequentially supplied to an exposure engine having a plurality of exposure devices and, based on the supplied exposure data, the exposure engine forms an exposure pattern on an exposure target substrate which moves relative to the exposure engine, lights respectively produced from the exposure device groups based on the identical exposure data supplied to each of the plurality of exposure device groups, are projected via optics so as to be superimposed one on top of another on the same area on the exposure target substrate.

10 Claims, 16 Drawing Sheets

Fig.9

SIMULATION EXAMPLE 1 OF MAJOR PARAMETER SETS

| DMD TYPE | SXGA (1280 × 1024 PIXELS) | |
|---|---|---|
| TARGET RESOLUTION b ON EXPOSURE SURFACE | 1.0 μm | |
| ROTATION ANGLE θ | APPROX. 1.146 DEGREE | |
| COMBINED MAGNIFICATION U OF OPTICS | APPROX. 3.624 × | |
| EXPOSURE DEVICE GROUPING | NO | YES (3 GROUPS) |
| VALUE OF n OR n' | 1000 | 300 |
| VALUE OF k | 20 | 6 (EQUIVALENTLY 18) |

Fig.10

SIMULATION EXAMPLE 2 OF MAJOR PARAMETER SETS

| DMD TYPE | SXGA (1280 × 1024 PIXELS) | |
|---|---|---|
| TARGET RESOLUTION b ON EXPOSURE SURFACE | 0.5 μm | |
| ROTATION ANGLE θ | APPROX. 1.432 DEGREE | |
| COMBINED MAGNIFICATION U OF OPTICS | APPROX. 1.450 × | |
| EXPOSURE DEVICE GROUPING | NO | YES (2 GROUPS) |
| VALUE OF n OR n' | 960 | 480 |
| VALUE OF k | 24 | 12 (EQUIVALENTLY 24) |

EXPOSURE APPARATUS AND EXPOSURE METHOD FOR PERFORMING HIGH-SPEED AND EFFICIENT DIRECT EXPOSURE

BACKGROUND OF THE INVENTION

1. Filed of the Invention

The present invention relates to an exposure apparatus and an exposure method for directly exposing an exposure target substrate, and more particularly to an exposure apparatus and an exposure method in which exposure data necessary for direct exposure is sequentially supplied to an exposure engine having a plurality of exposure devices and, based on the thus supplied exposure data, the exposure engine forms an exposure pattern on an exposure target object, for example, an exposure target substrate moving relative to the exposure engine.

2. Description of the Related Art

Generally, a wiring pattern on a wiring substrate is formed by applying a photoresist over the substrate, exposing the photoresist based on wiring pattern design data, and developing and printing the desired pattern on the substrate, followed by etching. In the exposure process, a photomask is usually used.

On the other hand, a patterning method based on direct exposure that does not use any photomasks has been proposed in recent years. According to this method, since corrections for the expansion, shrinkage, distortion, displacement, etc. of the substrate can be made to the exposure pattern in real time or in advance at the exposure data generation stage, remarkable improvements can be achieved in such points as the improvement of the manufacturing accuracy, the improvement of the manufacturing yield, the reduction of the delivery time, and the reduction of the manufacturing cost.

Examples of the patterning method based on direct exposure include a method that forms an exposure pattern by direct exposure by using, for example, a Digital Micromirror Device (DMD), an electron beam exposure machine, or the like. In one prior art example of the patterning method based on direct exposure that uses the DMD, Japanese Unexamined Patent Publication No. 10-112579 discloses a technique in which, when exposing the photoresist formed on an exposure target substrate, pattern data corresponding to the pattern to be exposed is generated and this pattern data is input to the Digital Micromirror Device (DMD), causing each of the micromirrors arranged thereon to tilt according to the pattern data; by thus changing the direction of the light reflected by each micromirror on the DMD as needed, the light is projected onto the resist on the exposure target substrate to form an exposure pattern that matches the pattern data.

FIG. 11 is a diagram schematically showing a conventional direct exposure system. It is to be understood that, throughout the drawings given hereinafter, component elements designated by the same reference numerals are component elements having the same functions.

The direct exposure system 100 comprises an exposure apparatus 101 and a computer 102 connected to the exposure apparatus 101. The computer 102 supplies exposure data to the exposure apparatus 101 and controls the exposure apparatus 101. The exposure apparatus 101 comprises a stage 110 on which an exposure target substrate 151 is mounted, and an exposing means 111 which moves in relative fashion over the surface of the exposure target substrate 151 in a direction indicated by an arrow in the figure. The exposing means 111 is equipped with one or more exposure engines (not shown) which are each assigned an area to be exposed on the surface of the exposure target substrate 151 and perform exposure operations in parallel. In each exposure engine, a plurality of exposure devices (not shown) for modulating light sources are arranged in a two-dimensional array. For example, when the direct exposure system 100 is of the type that uses the DMD, the micromirrors of the DMD correspond to the exposure devices.

FIG. 12 is a diagram showing the operating principle of the conventional exposure apparatus.

The exposing means 111, which moves in a relative fashion over the surface of the exposure target substrate 151, is equipped with a plurality of exposure engines #1 to #N (reference numeral 30) (N is a natural number) arranged in a direction perpendicular to the direction of the relative movement of the exposure target substrate 151. While the exposure target substrate 151 is moving relative to the exposure engines #1 to #N (reference numeral 30) at speed Vex, a stage controller 29 generates a signal synchronized to the relative movement (hereinafter called the "synchronizing signal") and supplies it to each of the exposure engines #1 to #N (reference numeral 30).

The exposure target substrate 151 is divided in a virtual manner into N areas called the "strips #1 to #N" (reference numeral 32). The exposure engines #1 to #N (reference numeral 30), while moving relative to the exposure target substrate 151 at speed Vex, perform exposure on their respectively corresponding strips #1 to #N (reference numeral 32). Here, the length of the exposure target substrate 151 in the direction of the relative movement (hereinafter referred to as the "length of the exposure target substrate), that is, the length of each of the strips #1 to #N (reference numeral 32), is denoted by $L_Y$ (hereinafter referred to as the "strip length"). Likewise, the length of the exposure target substrate 151 in the direction perpendicular to the direction of the relative movement (hereinafter referred to as the "width of the exposure target substrate) is denoted by $L_X$.

The area that each of the exposure engines #1 to #N (reference numeral 30) can expose at a time is limited. The width of the area on the exposure target substrate 151 that each exposure engine can expose in the direction perpendicular to the direction of the relative movement is not larger than the width $\Delta X$ of each of the strips #1 to #N (reference numeral 32) (hereinafter referred to as the "strip width"). Here, the relation $L_X=N\times\Delta X$ holds.

On the other hand, the length of the area on the exposure target substrate 151 that each exposure engine can expose in the direction of the relative movement is shorter than the strip length $L_Y$. Accordingly, each of the strips #1 to #N (reference numeral 32) is subdivided in a virtual manner into M "exposure blocks (i, j) (here, M is a natural number, while $1 \leq i \leq N$ and $1 \leq i \leq M$)" (reference numeral 33), and the exposure engine exposes these exposure blocks (i, j) in sequence. When the length of each exposure block (i, j) in the direction of the relative movement is denoted by $\Delta Y$, the relation $L_Y=M\times\Delta Y$ holds between the strip length $L_Y$ and the length $\Delta Y$ of each exposure block (i, j) in the direction of the relative movement.

The exposure data is typically data based on bitmap data. Since bitmap data contains a huge data amount, generating and storing the bitmap data prior to exposure would not be preferable as it would consume large memory resources. Therefore, to conserve the memory resources, for each of the exposure engines #1 to #N (reference numeral 30) the exposure data in bitmap form is generated based on design data in real time during the exposure process by dividing the data in a virtual manner for each of the exposure engines #1 to #N (reference numeral 30), that is, for each of the strips #1 to #N (reference numeral 32), and for each exposure block (i, j) in each of the strips #1 to #N (reference numeral 32); the thus generated data is first temporarily stored in memory, and then sequentially supplied to each corresponding one of the exposure engines #1 to #N (reference numeral 30). Accordingly, each of the exposure engines #1 to #N (reference numeral 30) performs the direct exposure based on the exposure data of bitmap form supplied for each exposure block (i, j). The series of these operations is performed based on the synchronizing signal that the stage controller 29 supplies as the reference signal to each of the exposure engines #1 to #N (reference numeral 30).

FIG. 13 is a flowchart showing the data processing flow in the conventional direct exposure apparatus.

As shown in FIG. 13, first the design data 51 is converted into intermediate data 52 in a first data conversion process S101. As the size of the intermediate data 52 is small compared to the size of the bitmap data, and as the first data conversion step S101 need not be performed in real time during the exposure process, the intermediate data 52 may be generated in advance and stored in memory.

In step S102, the intermediate data for one exposure block is read. Next, an alignment/correction step S103 is performed on the intermediate data thus read for one exposure block, and bitmap data 53 is generated in step S104 and temporarily stored in memory. In step S105, the generated bitmap data 53 is supplied to the corresponding exposure engine in synchronism with the synchronizing signal. Here, the realtime process performed in the above steps S102 to S105 is collectively referred to as the "second data conversion process." Using the bitmap data 53 supplied for each exposure block through the second data conversion process, the exposure engine performs the direct exposure in step S106. When the exposure on the one exposure block by the exposure engine is completed, the process returns to step S102, where the second data conversion process is performed to obtain the bitmap data 53 for the next exposure block. To describe the above series of processing in another way, in step S106 the exposure engine is "consuming", at a constant speed, the bitmap data 53 "produced" through the second data conversion process in synchronism with the synchronizing signal generated by the stage controller 29.

FIG. 14 is a schematic diagram illustrating the concept of the exposure data of bitmap form used in the direct exposure process by the conventional direct exposure apparatus.

The exposure data is data based on bitmap data composed of pixels arranged in a matrix of n rows and m columns (n and m are integers) as shown schematically in FIG. 14. The coordinates of each pixel in the bitmap data are represented by g(r, c). Here, r indicates the row number in the bitmap data ($0 \leq r \leq n-1$, where r is an integer), and c indicates the column number in the bitmap data ($0 \leq c \leq m-1$, where c is an integer). The resolution, i.e., pixel spacing (hereinafter called the "unit pixel spacing"), of the bitmap data is denoted by b. It can be said that the schematic diagram of the bitmap data illustrated in FIG. 14 directly represents the exposure pattern formed (or to be formed) on the surface of the exposure target substrate mounted on the stage (not shown).

FIG. 15 is a schematic diagram illustrating the arrangement of light sources in one exposure engine that performs the direct exposure using the exposure data shown in FIG. 14. Open circles in the figure indicate the light sources.

The exposure engine that uses bitmap data such as shown in FIG. 14 usually has light sources arranged in a two-dimensional array as shown in FIG. 15. The light sources are arranged in a corresponding relationship to the bitmap data of FIG. 14; that is, m light sources per row are arranged in the column direction, and the spacing of the light sources is equal to b which is the same as the resolution (i.e., the unit pixel spacing) of the bitmap data. The column number c of the bitmap data directly corresponds to the column number c of the light source in the exposure head.

As for the light source arrangement in the row direction, the exposure head is designed so that the spacing D between the rows is equal to p times (p is an integer) the unit pixel spacing b in the bitmap data, that is, D=pb. Here, k light sources per column are arranged in the row direction, and the row number is represented by R ($0 \leq R \leq k-1$, where R is an integer).

The light sources can be switched on and off independently of each other a predetermined maximum number of times per unit time (called the "frame"). This switching speed is called the frame rate f. For example, when the exposure apparatus is of the type that uses the DMD, the angular switching rate of each micromirror (i.e., the modulation rate of the DMD) corresponds to the frame rate f, and the angle of each micromirror is controlled for each frame.

The exposure target substrate mounted on the stage (not shown) moves relative to the exposure engine (i.e., the light sources) at a constant speed in a prescribed direction. That is, the bitmap data shown in FIG. 14 also moves in a virtual manner relative to the exposure engine (i.e., the light sources) shown in FIG. 15. This virtual relative movement of the bitmap data is accomplished by sequentially supplying the necessary bitmap data to the exposure engine in synchronism with the synchronizing signal that the stage controller supplies as the reference signal.

FIGS. 16A, 16B, 17A, and 17B are schematic diagrams for explaining the relationship between the bitmap data shown in FIG. 14 and the light source arrangement in the exposure engine shown in FIG. 15. As stated previously, the bitmap data schematically shown in the figure corresponds to the exposure pattern formed (or to be formed) on the surface of the exposure target substrate mounted on the stage (not shown). Here, the case where the exposure target substrate moves at speed Vex relative to the light sources R in a virtual manner in a direction indicated by an arrow in the figure, is considered. In the figure, to simplify the illustration, only some of the light sources in the third column are shown, and the other light sources are not shown.

First, as the initial condition, consider the case where the light source R=0 is aligned with the pixel g(0, 3) in the bitmap data, as shown in FIG. 16A. In this condition, the synchronizing signal is sent to the exposure engine, causing the light source R=0 to emit light and thus exposing the pixel g(0, 3).

When, from the initial condition, the exposure target substrate mounted on the stage moves relative to the light source by a distance corresponding to the resolution (i.e., the unit pixel spacing) b of the bitmap data (FIG. 16B), the synchronizing signal is again sent to the exposure engine. At this time, the pixel g(1, 3) comes into alignment with the light source R=0, and the pixel can thus be exposed. As the light source spacing D (=pb, where p is an integer) is sufficiently larger than the resolution b of the bitmap, the pixel g(0, 3) in FIG. 16B is not aligned with any light source, and is therefore not exposed.

When the exposure target substrate mounted on the stage further moves relative to the light source by the distance b (FIG. 17A), the synchronizing signal is again sent to the exposure engine. At this time, the pixel g(2, 3) comes into alignment with the light source R=0, and the pixel can thus be exposed. On the other hand, at this time, the pixels g(0, 3) and g(1, 3) are not aligned with any light source, and are therefore not exposed.

When the exposure target substrate mounted on the stage further moves relative to the light source by the distance b (FIG. 17B), the synchronizing signal is again sent to the exposure engine. At this time, the pixel g(3, 3) comes into alignment with the light source R=0, while the pixel g(0, 3) comes into alignment with the light source R=1; as a result, these pixels can be exposed. On the other hand, at this time, the pixels g(1, 3) and g(2, 3) are not aligned with any light source, and are therefore not exposed.

Thereafter, each time the exposure target substrate mounted on the stage moves relative to the light source by the distance b, the synchronizing signal is sent to the exposure engine, and any pixel that comes into alignment with the light source can be exposed. For example, in the case of the pixel g(0, 3), when the exposure target substrate mounted on the stage moves in a relative fashion by the distance pb from the initial condition, the pixel comes into alignment with the light source R=1, and the pixel can thus be exposed a second time. In the case of the pixel g(1, 3), for example, when the exposure target substrate mounted on the stage moves in relative fashion by the distance (p+1)b from the initial condition, the pixel comes into alignment with the light source R=1, and the pixel can thus be exposed a second time.

In this way, as the exposure target substrate moves in relative fashion below the exposure engine having k light sources in each column, each spot on the exposure target substrate which corresponds to each pixel in the bitmap data can be exposed to light a total of k times. In the direct exposure apparatus, whether the intended exposure process is completed or not is determined by whether the light energy accumulated through k exposures exceeds the threshold for exposing the photoresist applied on the exposure target substrate. Accordingly, if the number, k, of light sources is sufficiently large, then even if some of the k light sources fail to emit light properly due to the failure of micromirrors in the DMD or of driving transistors in the LCD, the possibility that such failure will have a serious effect on the final exposure result is small. Stated another way, such redundancy in the number of light sources constitutes the basis of the reliability of the direct exposure apparatus.

As described above, since the amount of the exposure data is very large, the exposure data is generated based on design data in real time for each exposure block during the exposure process in order to conserve memory resources, and the generated exposure data is supplied to the corresponding exposure engine. That is, the exposure data "produced" for each exposure block in real time in the second data conversion process in FIG. 13 is sequentially "consumed" for each exposure block at a constant speed by the corresponding exposure engine.

The amount of the bitmap data composed of pixels arranged in n rows and m columns (n and m are integers) that the exposure engine of frame rate f "consumes" per unit time is proportional to "m×n×f", i.e., the product of m, n, and f. The product "m×n×f" is generally known as the "bandwidth", which is expressed in "bits/sec". The bandwidth is a measure of the capacity of data transmission between the exposure engine and the memory device in which the bitmap data is stored, and usually there is an upper limit value dependent on system configuration, etc.

It will be easily understood that the width $\Delta X$ of the strip on the exposure target substrate 151 that each exposure engine can expose is proportional to the number, m, of columns in the bitmap data when one considers that the bitmap data of n rows and m columns is supplied to the exposure engine. Accordingly, for an exposure target substrate having a certain width $L_X$ (=N×$\Delta X$), the larger the number, m, of columns in the bitmap data, the smaller the number of exposure engines required to cover the width $L_X$ of the exposure target substrate, and thus the cost of the exposure engines can be reduced correspondingly. That is, by using exposure devices having a larger number of pixels for the exposure engines, the number, m, of columns in the bitmap data can be increased. For example, when the direct exposure system is of the type that uses the DMD, the number of pixels increases in the order of SVGA, XGA, and SXGA.

At this time, when there is an upper limit to the bandwidth, that is, when the bandwidth imposes a constraint on the system configuration, if the number, m, of columns in the bitmap data is increased, the value of the product "m×n×f" naturally increases and, as a result, the frame rate f has to be reduced. Reducing the frame rate f means reducing the exposure speed of the direct exposure system, that is, reducing the throughput of the direct exposure process, which is not desirable. To address this, a method for increasing the exposure process performance of the direct exposure system without reducing the frame rate f is disclosed in Japanese Patent Publication NO. 2004-1244; according to the technique described therein, of the exposure devices arranged in a two-dimensional array in the exposure engine, a smaller number of exposure devices than the total number are used for direct exposure.

Here, if there is no upper limit value on the bandwidth, as the amount of data proportional to the product "m×n×f" has to be processed, there can occur cases where the processing performance of CPU or FPGA that performs the data processing becomes a bottleneck.

As described above, the larger the number, m, of columns in the bitmap data, the smaller the number of exposure engines required to cover the width $L_X$ of the exposure target substrate, and thus the cost of the exposure engines can be reduced correspondingly; further, the higher the frame rate f, the faster the exposure speed of the direct exposure system can be made, which therefore can be said to be desirable. In reality, however, an upper limit value dependent on system configuration exists on the bandwidth that defines the capacity of data transmission between the exposure engine and the memory device in which the bitmap data is stored. With the technique disclosed in the above-cited Japanese Patent Publication NO. 2004-1244, as, of the exposure devices arranged in a two-dimensional array in the exposure engine, a smaller number of exposure devices than the total number are used for direct exposure by reducing the number, n, of rows in the bitmap data, a certain degree of effect can be achieved even when there is an upper limit to the bandwidth. However, not all the exposure devices, but selected ones of the exposure devices in the exposure engine, are actually used for direct exposure, and the remaining exposure devices are not used. That is, as all the exposure devices in the exposure engine are not used effectively, the efficiency is low.

In view of the above problem, it is an object of the present invention is to provide an exposure apparatus and an exposure method that can perform high-speed and efficient direct exposure based on exposure data sequentially supplied to each exposure engine having a plurality of exposure devices.

SUMMARY OF THE INVENTION

To achieve the above object, in the present invention, the plurality of exposure devices in each exposure engine are first divided into groups. Each group thus formed is called the "exposure device group". The exposure device groups are formed by dividing the plurality of exposure devices arranged in a two-dimensional array into groups along a direction perpendicular to the direction of relative movement of the exposure target substrate. In this case, if one looks at the n-row, m-column bitmap data to be used for direct exposure, it is seen that, according to the present invention, the number, n, of rows in the bitmap data can be reduced compared with the bitmap data before dividing the two-dimensional array of exposure devices into groups. As a result, if there is an upper limit value on the bandwidth that defines the capacity of data transmission between the exposure engine and the memory device in which the bitmap data is stored, the frame rate f can be further increased, and thus the speedup of the direct exposure process can be achieved. Furthermore, since the number, m, of columns in the bitmap data can also be increased, the number of exposure engines can be reduced, achieving a reduction in the cost of the exposure engines, while also making it possible to handle a larger amount of bitmap data.

In the direct exposure apparatus, each spot on the exposure target substrate which corresponds to each pixel in the bitmap data can be exposed to light a total of k times while the exposure target substrate moves in relative fashion below the exposure engine having a prescribed number (for example, k) of light sources in each column. Here, whether the intended exposure process is completed or not is determined by whether the light energy accumulated through k exposures exceeds the threshold for exposing the photoresist applied on the exposure target substrate. However, the amount of light energy that each one of the exposure device groups can project onto the exposure target substrate moving relative to the exposure engine is smaller than the amount of light energy that the conventional exposure engine not divided into groups projects. If this light energy does not exceed the threshold for exposing the photoresist applied on the exposure target substrate, the exposure of the photoresist cannot be accomplished. One possible method to compensate for such reduction in the light energy would be to increase the light energy of the light source, but this would not be desirable as it would lead to an increase in the cost of the light source. In view of this, according to the present invention, the same exposure data is supplied to the respective exposure device groups so that the respective exposure device groups produce light for projection based on the same exposure data. Besides, the lights produced from the respective exposure device groups are projected via optics so as to be superimposed one on top of another on the same area on the exposure target substrate. In this manner, the light energy necessary to expose the photoresist is obtained.

As described above, the greatest feature of the exposure apparatus of the present invention is that the plurality of exposure devices in each exposure engine are divided into a plurality of exposure device groups, and that the lights produced from the respective exposure device groups based on the same exposure data are projected via optics so as to be superimposed one on top of another on the same area on the exposure target substrate. FIG. 1 is a diagram showing the basic principle of the exposure apparatus according to the present invention.

According to the present invention, the exposure apparatus 1, in which exposure data necessary for direct exposure is sequentially supplied to an exposure engine 30 having a plurality of exposure devices and, based on the thus supplied exposure data, the exposure engine 30 forms an exposure pattern on an exposure target substrate (exposure target) 151 moving relative to the exposure engine 30, comprises: data supplying means 11 for supplying the same exposure data 10 to each of a plurality of exposure device groups A to C formed by dividing the plurality of exposure devices in the exposure engine 30 into groups; and optics 12 via which lights respectively produced from the exposure device groups A to C based on the exposure data 10 supplied from the data supplying means 11 are projected so as to be superimposed one on top of another on the same area T on the exposure target substrate 151.

FIG. 2 is a schematic diagram for explaining how the exposure engine in the exposure apparatus of the present invention is divided into groups. In the figure, the exposure engine 30 on the side that faces the exposure target substrate (not shown) is shown in schematic form. The number of exposure devices Q (each indicated by an open circle) shown in the figure is only illustrative; in one specific example, the exposure devices Q are arranged in 1024 rows and 1280 columns.

The exposure device groups A to C are formed by dividing the plurality of exposure devices Q arranged in a two-dimensional array in the exposure engine 30 into groups along a direction perpendicular to the direction of the relative movement of the exposure target substrate. Each of the exposure device groups A to C is supplied with the same exposure data 10 from the data supplying means 11. Further, as described with reference to FIG. 1, in the present invention the optics 12 are provided via which the lights produced from the respective exposure device groups A to C are projected so as to be superimposed one on top of another on the same area T on the exposure target substrate 151. The optics 12 comprise such optical components as prisms, mirrors and/or lenses, etc., and a gap having a prescribed width is provided between each exposure device group so that the optics can be arranged along the gap. Accordingly, exposure devices Q' (each indicated by a dotted circle) located in the gap are not driven to perform exposure. Exposure data for this purpose is supplied, for example, in the form of a signal that does not cause the exposure devices to produce light for data corresponding to the exposure devices Q' located in the gap.

FIG. 3 is a schematic diagram for conceptually explaining how the lights are projected so as to be superimposed one on top of another via the optics in the exposure apparatus of the present invention.

As explained with reference to FIGS. 1 and 2, each of the exposure device groups A to C is supplied with the same exposure data 10 from the data supplying means 11. Each of the exposure device groups A to C produces light based on the same exposure data 10. In the direct exposure apparatus, since a wiring pattern is directly formed by exposing the photoresist to light radiation, the light produced from each of the exposure device groups A to C already shows the content corresponding to the shape of the intended wiring pattern. In this patent specification, the content of the light produced from each of the exposure device groups A to C is regarded as a "virtual screen", and this screen is called the "sub-screen"; in the figure, the respective sub-screens are indicated by reference characters S-A, S-B, and S-C. Since the sub-screens S-A, S-B, and S-C of the respective exposure device groups A to C are generated by supplying the same exposure data to the respective exposure device groups A to C, they are identical in content. That is, information at the same coordinate positions (i, j) on the respective sub-screens S-A, S-B, and S-C is the same in content.

The optics 12 are arranged so that the lights produced from the respective exposure device groups A to C are projected so as to be superimposed one on top of another on the same area T on the exposure target substrate 151. Accordingly, the sub-screens S-A, S-B, and S-C projected via the optics 12 are superimposed one on top of another on the same area T on the exposure target substrate 151. The coordinates P (i, j) on the respective sub-screens S-A, S-B, and S-C correspond to the coordinates P′″ (i, j) in the area T on the exposure target substrate 151.

In this way, according to the present invention, the light energies emanating from the respective exposure device groups are combined on the exposure target substrate 151 by way of the optics. The light energy necessary to expose the photoresist can thus be obtained.

In FIGS. 1 to 3, the exposure devices in the exposure engine have been divided into three groups as an example, but the present invention is not limited to this particular example; that is, the exposure devices may be divided into some other number of groups.

BRIEF DESCRIPTION OF THE DRAWINGS

The present invention will be more clearly understood from the description as set forth below with reference to the accompanying drawings, wherein:

FIG. 9 is a diagram showing the result of a computer simulation (simulation example 1) according to the embodiment of the present invention;

FIG. 10 is a diagram showing the result of a computer simulation (simulation example 2) according to the embodiment of the present invention;

DESCRIPTION OF THE PREFERRED EMBODIMENTS

The greatest feature of the exposure apparatus of the present invention is that the plurality of exposure devices in each exposure engine are divided into a plurality of exposure device groups, and that the lights produced from the respective exposure device groups based on the same exposure data are projected via optics so as to be superimposed one on top of another on the same area on the exposure target substrate.

In the embodiment of the present invention, the "same exposure data" to be supplied to the respective device groups is generated by using the exposure data generated for one particular exposure device group and duplicating the same for the other exposure device groups. Generally, a very large amount of computation is required to generate exposure data but, by duplicating the data as just described, the amount of computation can be reduced, which offers a significant effect of being able to enhance the speed of the entire processing.

Figure 4:
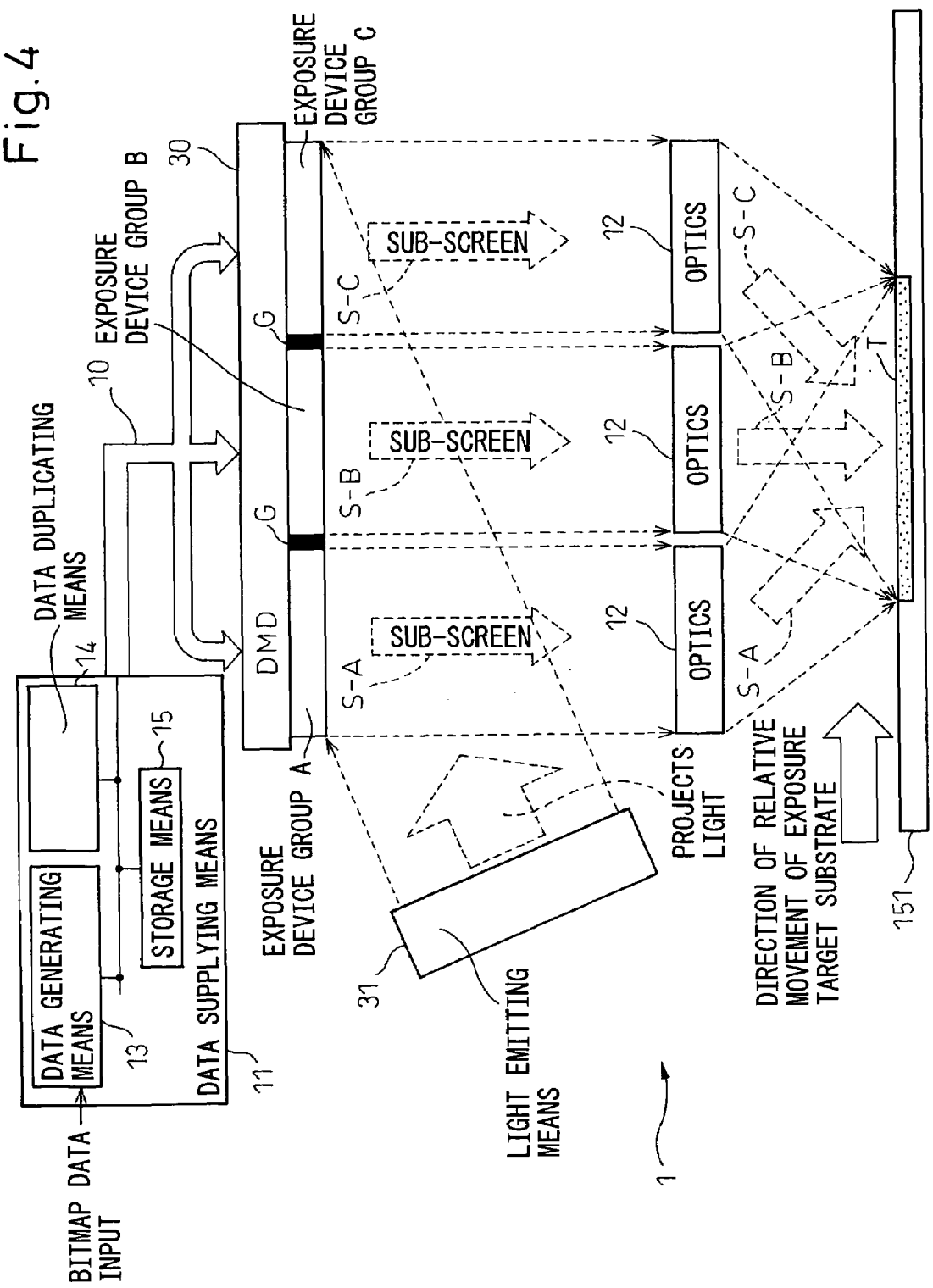
FIG. 4 is a diagram schematically showing the configuration of an exposure apparatus according to an embodiment of the present invention.

FIG. 4 is a diagram schematically showing the configuration of the exposure apparatus according to the embodiment of the present invention.

Figure 1:
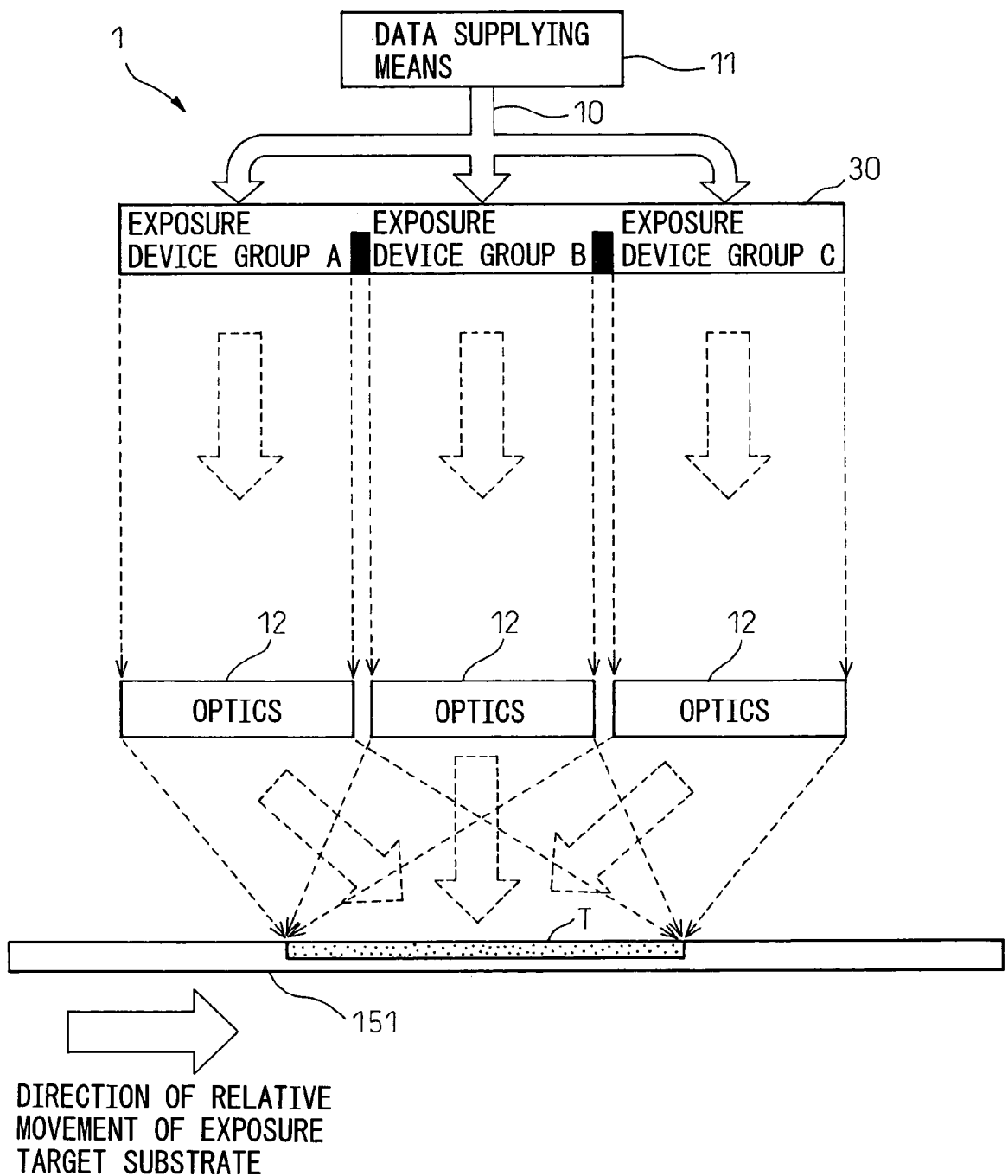
FIG. 1 is a diagram showing the basic principle of an exposure apparatus according to the present invention.
Figure 2:
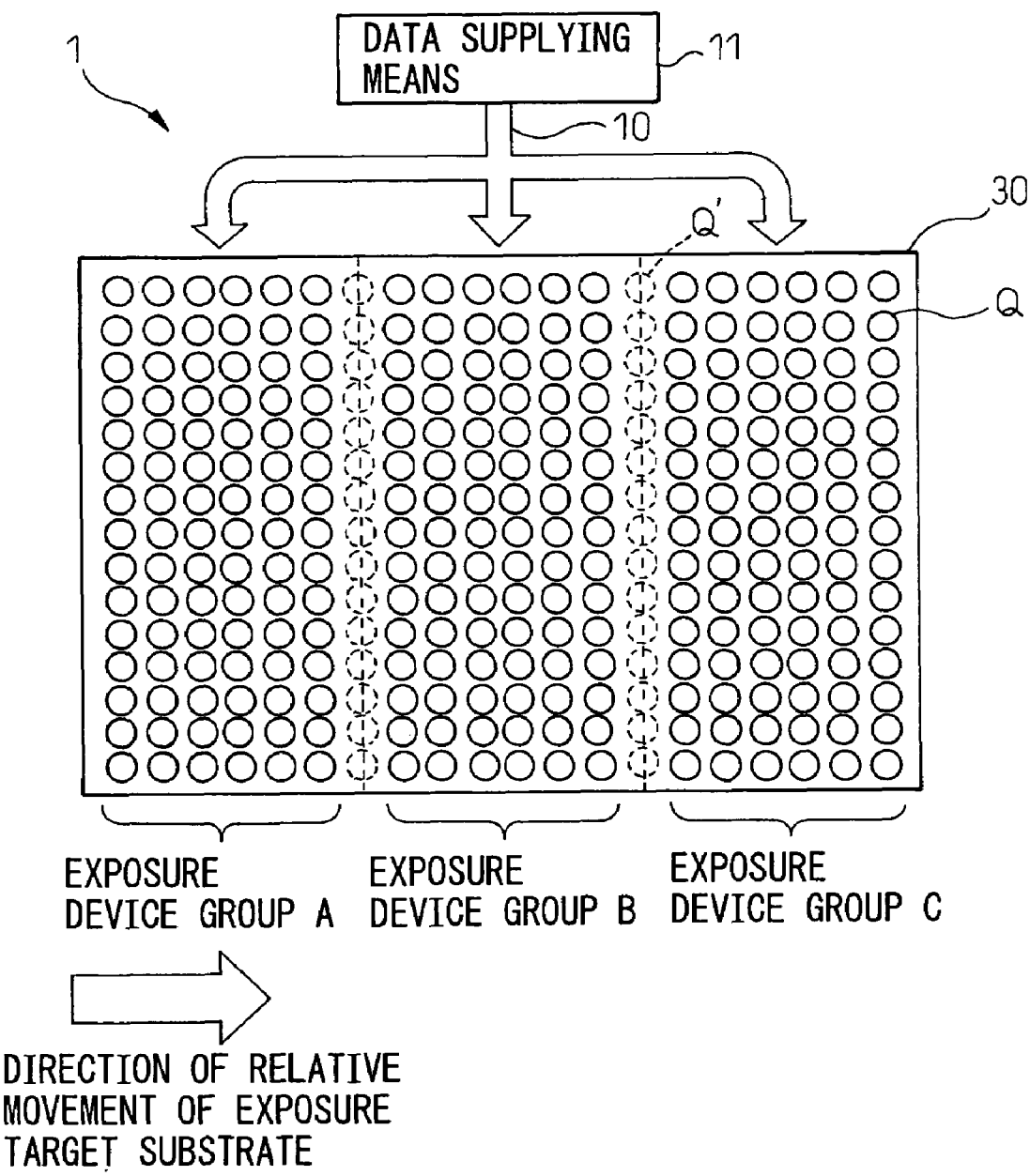
FIG. 2 is a schematic diagram for explaining how an exposure engine in the exposure apparatus of the present invention is divided into groups.
Figure 3:
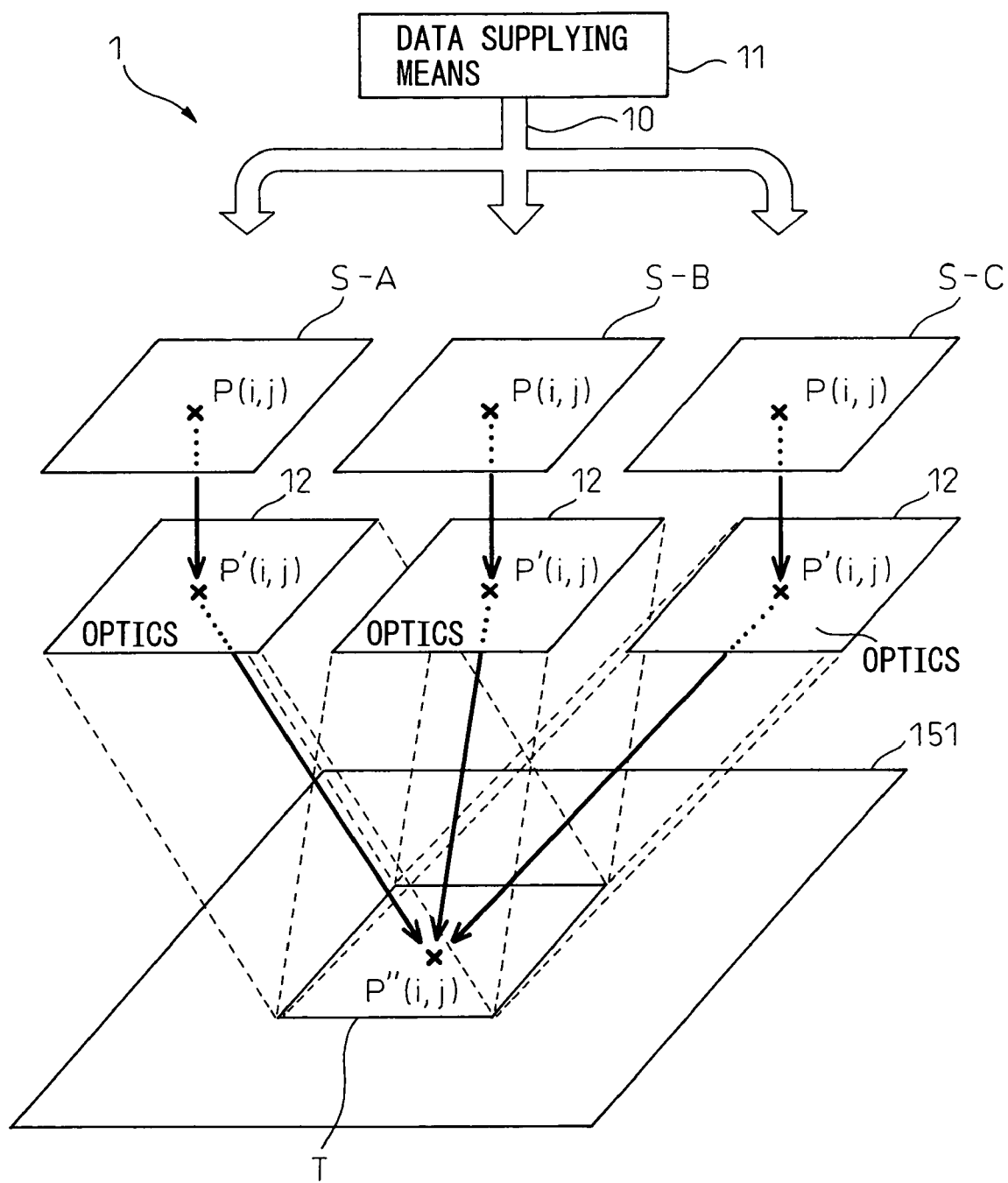
FIG. 3 is a schematic diagram for conceptually explaining how lights are projected so as to be superimposed one on top of another via optics in the exposure apparatus of the present invention.

The exposure apparatus 1 according to the present embodiment comprises the data supplying means 11 and optics 12 previously described with reference to FIG. 1. In FIG. 4, only one exposure engine 30 is shown to simplify the explanation.

In the present embodiment, it is assumed that the exposure engine 30 in the exposure apparatus 1 is of the type that uses the DMD. In this case, each micromirror on the DMD corresponds to each of the exposure devices arranged in a two-dimensional array. The number of micromirrors on the DMD, that is, the number of exposure devices (pixels), is, for example, 848×600 pixels in the case of the DMD of SVGA type, 1024×768 pixels in the case of the DMD of XGA type, and 1280×1024 pixels in the case of the DMD of SXGA type.

The exposure devices (DMD micromirrors) arranged in the two-dimensional array in the exposure engine 30 are divided into groups along the direction perpendicular to the direction of the relative movement of the exposure target substrate. As an example, in the present embodiment, the exposure devices are divided into three groups, which are designated as the exposure device groups A to C, respectively. A gap G having a prescribed width is provided between the exposure device groups A and B and also between the exposure device groups B and C, since the optics 12 comprising such optical components as prisms, mirrors and/or lenses, etc. are arranged between the respective groups. The details of the width of the gap G will be described later.

A light emitting means 31 projects light to the DMD in the exposure engine 30. The light projected onto the DMD is reflected by the micromirrors on the DMD and directed to the exposure target substrate 151 moving at a prescribed speed relative to the exposure engine 30. Each individual micromirror on the DMD is caused to tilt according to the exposure data supplied to the exposure engine 30, causing the direction of the light reflected by each micromirror on the DMD to change as needed and thus accomplishing the exposure of the photoresist on the exposure target substrate 151 to form an exposure pattern based on the exposure data.

The data supplying means 11 comprises a data generating means 13, a data duplicating means 14, and a storage means 15. The data generating means 13 generates exposure data 10 corresponding to one exposure device group selected from among the plurality of exposure device groups A to C formed by dividing the plurality of exposure devices in the exposure engine 30 into groups. The exposure data 10 is generated by converting bitmap data into DMD frame data that can be processed by the exposure engine. Using the exposure data 10 generated by the data generating means 14, the data duplicating means 14 creates as many duplicates of the exposure data 10 as there are exposure device groups excluding the one exposure device group. The storage means 15 temporarily stores the exposure data 10 generated by the data generating means 13, during the processing for duplication by the data duplicating means 14.

The exposure data 10 generated by the data generating means 13 or created by the data duplicating means 14 is supplied to the exposure engine 30. In the exposure device groups A to C, the micromirrors are caused to tilt based on the same exposure data 10, thereby adjusting the light to be directed toward the exposure target substrate 151; therefore, the lights produced from the respective exposure device groups A to C form the sub-screens S-A, S-B, and S-C which are identical in content.

The lights produced from the respective exposure device groups A to C based on the exposure data 10 generated by the data generating means 13 or created by the data duplicating means 14 are projected via the respective optics 12 so as to be superimposed, one on top of another, on the same area T on the exposure target substrate 151. The area T is an exposure target area. The optics 12 here can be constructed from such optical components as prisms, mirrors and/or lenses, etc. by using known techniques. Information at the same coordinate positions on the respective sub-screens S-A, S-B, and S-C is the same in content, and is superimposed at the corresponding coordinate position in the area T on the exposure target substrate 151. That is, light energy equal to the product of the light energy of one exposure device group times the number of exposure device groups can be projected onto the exposure target substrate via the optics 12. The light energy necessary to expose the photoresist is provided in this manner.

Figure 5:
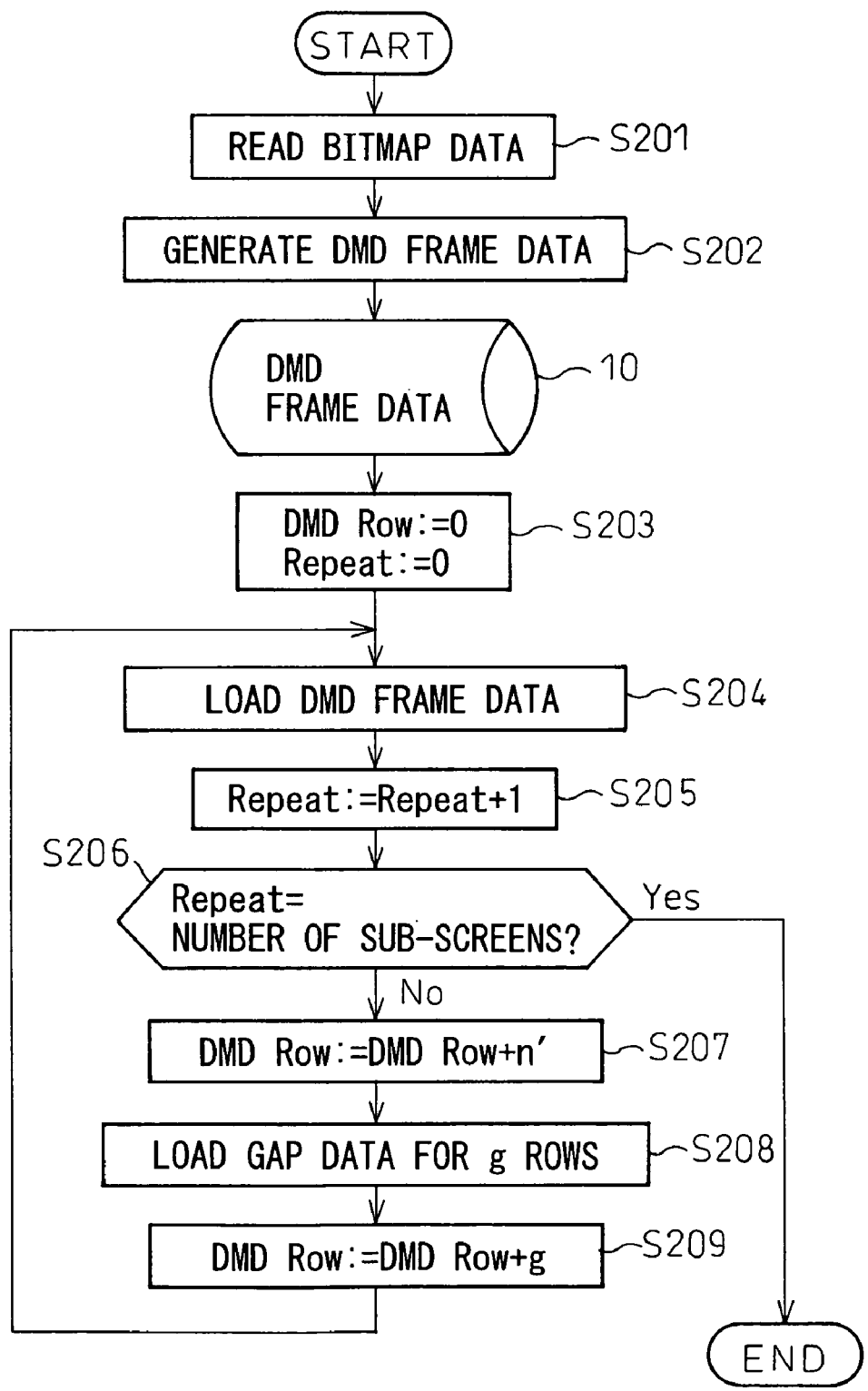
FIG. 5 is a flowchart illustrating the operation flow of the exposure apparatus according to the embodiment of the present invention.

FIG. 5 is a flowchart illustrating the operation flow of the exposure apparatus according to the embodiment of the present invention.

First, in step S201, the data generating means 13 in FIG. 4 reads the minimum necessary bitmap data to construct one sub-screen, that is, to create exposure data corresponding to one exposure device group in a given frame. Next, in step S202, the data generating means 13 converts the thus readout bitmap data into DMD frame data 10 that can be processed by the exposure engine, and thus generates the exposure data. The DMD frame data 10 is temporarily stored in the storage means 15 in FIG. 4. Here, when the number of pixel rows in the DMD frame data 10 for one sub-screen is denoted by n', and the number of pixel rows in the DMD frame data necessary for the area that one conventional exposure engine, with its exposure devices not divided into groups, could expose at a time, is denoted by n, then the relation n'<n holds. Further, in the embodiment of FIG. 4, as the exposure devices in each exposure engine are divided into three groups, the relation $3n'\cong n$ holds.

The subsequent steps S203 to S209 concern the exposure data duplication process performed by the data duplicating means 14 in FIG. 4.

First, in step S203, as an initial setting for the exposure data duplication process, "DMD row" which indicates the row address (row number) in the work memory within the DMD is set to 0 in order to determine the first load destination of the DMD frame data 10. The number of pixel rows in the DMD frame data matches the number of rows of the exposure devices arranged in the two-dimensional array on the DMD of the exposure engine 30, and the "DMD row" is a parameter that specifies the address of the row number. In the same step S203, "Repeat" which is a parameter for counting the number of repetitions is also set to 0. The number of repetitions "Repeat" can count up to a maximum number equal to the number of exposure device groups ("3" in the embodiment of FIG. 4).

Next, in step S204, the DMD frame data 10 for one exposure device group, that is, for one sub-screen, is read out of the storage means 15 in FIG. 4 and, starting from the row specified by "DMD row", the DMD frame data 10 is loaded into the work memory (not shown) provided within the DMD for that exposure device group. In the next step S205, the number of repetitions "Repeat" is incremented by 1.

Next, in step S206, it is determined whether the number of repetitions "Repeat" matches the number of exposure device groups. If they match, the duplication process for that exposure data is terminated, but if they do not match, the process proceeds to step S207. In step S207, "DMD row" is incremented by the number, n', of pixel rows in the DMD frame data 10 for one sub-screen.

Next, in step S208, gap data for a predetermined number, g, of rows is loaded starting from the row specified by "DMD row" updated in step S207. As previously described, the gap G having a prescribed width (in this embodiment, the width equal to the number, g, of pixel rows) is provided between each exposure device group to allow for the space for the arrangement of the optics 12. Some DMD micromirrors are located in this gap G, but these micromirrors are not caused to tilt so as to direct the reflected light toward the exposure target substrate. Accordingly, as the DMD frame data for the micromirrors located in the gap G, gap data that does not cause the micromirrors to tilt so as to direct the reflected light toward the exposure target substrate is set for the number, g, of pixel rows corresponding to the gap width. In the next step S209, "DMD Row" is incremented by the number, g, of pixel rows.

The process from step S204 to step S209 is repeated a number of times equal to the number of exposure device groups, i.e., the number of sub-screens, until the number of repetitions "Repeat" matches the number of sub-screens in step S206. In this way, the same DMD frame data (exposure data) can be supplied to the respective exposure device groups. After the data supply for one frame is completed, the process returns to step S201 to repeat the data supply process for the next frame.

Figure 6:
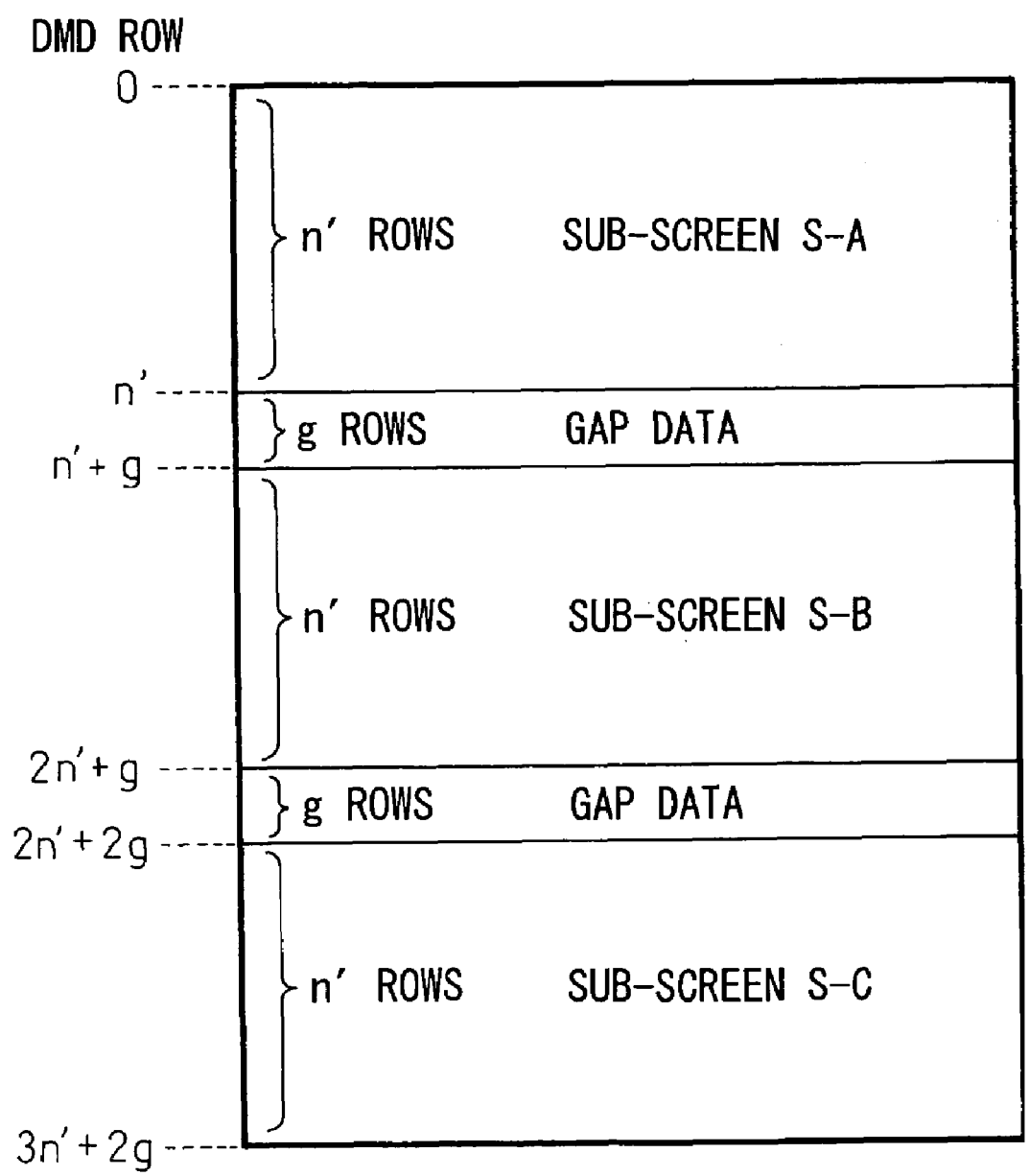
FIG. 6 is a conceptual diagram illustrating the structure of DMD frame data used in the embodiment shown in FIGS. 4 and 5.

FIG. 6 is a conceptual diagram illustrating the structure of the DMD frame data used in the embodiment shown in FIGS. 4 and 5. In the embodiment shown in FIG. 4, the exposure devices are divided into three groups, and in the duplication process shown in FIG. 5, the DMD frame data for the respective sub-screens S-A, S-B, and S-C are stored in the work memory areas specified by "DMD Row", i.e., the areas "0 to n'", "n'+g to 2n'+g", and "2n'+2g to 3n'+2g", respectively; here, the respective DMD frame data are identical in content. On the other hand, the gap data are stored in the work memory areas specified by "DMD Row", i.e., the areas "n' to n'+g" and "2n'+g to 2n'+2g", respectively.

As described above, according to the embodiment of the present invention, the same exposure data to be supplied to the respective device groups is generated by using the exposure data generated for one exposure device group and creating as many duplicates of the exposure data as there are exposure device groups excluding the one exposure device group. Generally, a very large amount of computation is required to generate the exposure data, but the amount of computation performed in the above duplication process is negligible compared with the amount of computation required to generate the exposure data. In this way, according to the present embodiment, since the amount of computation can be greatly reduced, speedup of the entire process can be achieved.

Figure 7:
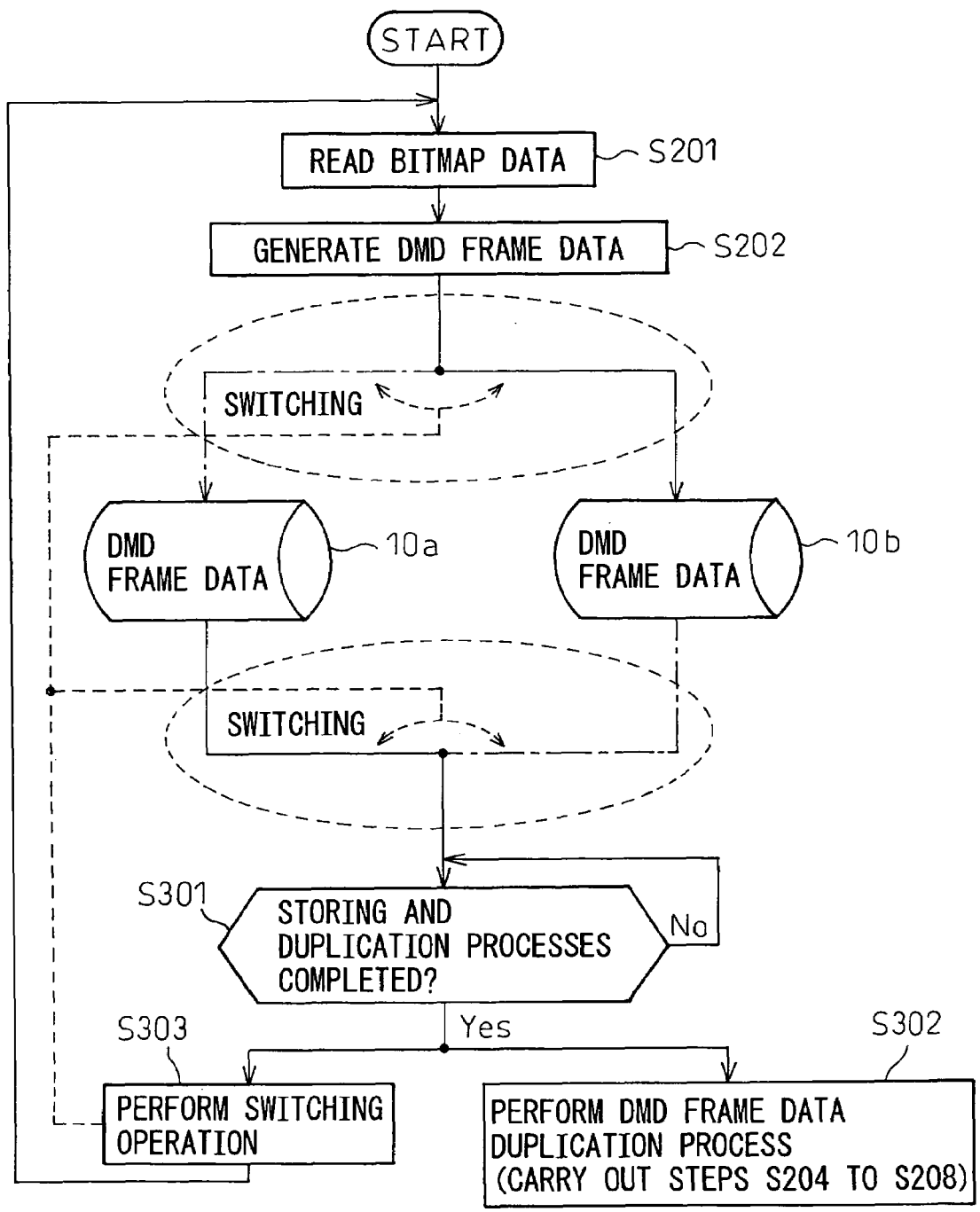
FIG. 7 is a flowchart illustrating the operation flow of the exposure apparatus according to a modified example of the embodiment of the present invention.

FIG. 7 is a flowchart illustrating the operation flow of the exposure apparatus according to a modified example of the embodiment of the present invention. This modified example aims to further speed up the exposure process in the embodiment described with reference to FIG. 5. That is, a plurality of storage means are provided to temporarily store the exposure data (DMD frame data) generated by the data generating means for duplication by the data duplicating means 14. Using the plurality of storage means, the DMD frame data duplication process performed in the data duplicating means for a given frame (steps S204 to S209 shown in FIG. 5 are collectively shown as step S302 in FIG. 7) is carried out in parallel with the generation of new DMD frame data for the next frame that follows the given frame (steps S201 and S202). The above storage means may be implemented by increasing the capacity of the storage means 15 in FIG. 4 and by dividing it into a plurality of storage areas, or may be implemented as mutually independent storage means. At least two storage means should be provided. In this modified example, two storage means are provided.

The processing in steps S201 and S202 in FIG. 7 is the same as that described with reference to FIG. 5. However, the DMD frame data generated in step S202 is stored in one of the plurality of storage means (in the example of FIG. 7, one of the two storage means). That is, for any given frame, the data generating means 13 in FIG. 4 is connected to one or the other of the two storage means. In step S301, it is determined whether the DMD frame data generated for the current frame by the data generating means 13 in FIG. 4 has been stored in any one of the storage means 15, and it is also determined whether the duplication process of the DMD data of the previous frame has been completed.

A further detailed description will be given below by dealing with an example in which, in a given frame, DMD frame data is generated through the steps S201 and S202 and stored in one (10a) of the two storage means 15.

When the completion of the above two processes is confirmed in step S301, the stored DMD frame data 10a is read out, and the duplication process for the DMD frame data 10a is started in step S302. In parallel with this duplication process, in step S303 the connection of the data generating means 13 is switched to the other one of the two storage means 15, and the process from step S201 onward is repeated for the next frame that follows the given frame. When new DMD frame data 10b for the next frame is generated in step S202, the new DMD frame data 10b is stored in the storage means (10b) which is different from the storage means that stores the DMD frame data 10a for the previous frame (that is, the DMD frame data 10a currently in the process of duplication). Then, step S301 is carried out. Thereafter, the same process is repeated.

In this way, in the modified example, as the data processing for two successive frames is executed concurrently by using the technique of pipelining, the exposure process can be further speeded up compared with the embodiment described with reference to FIG. 5.

Figure 12:
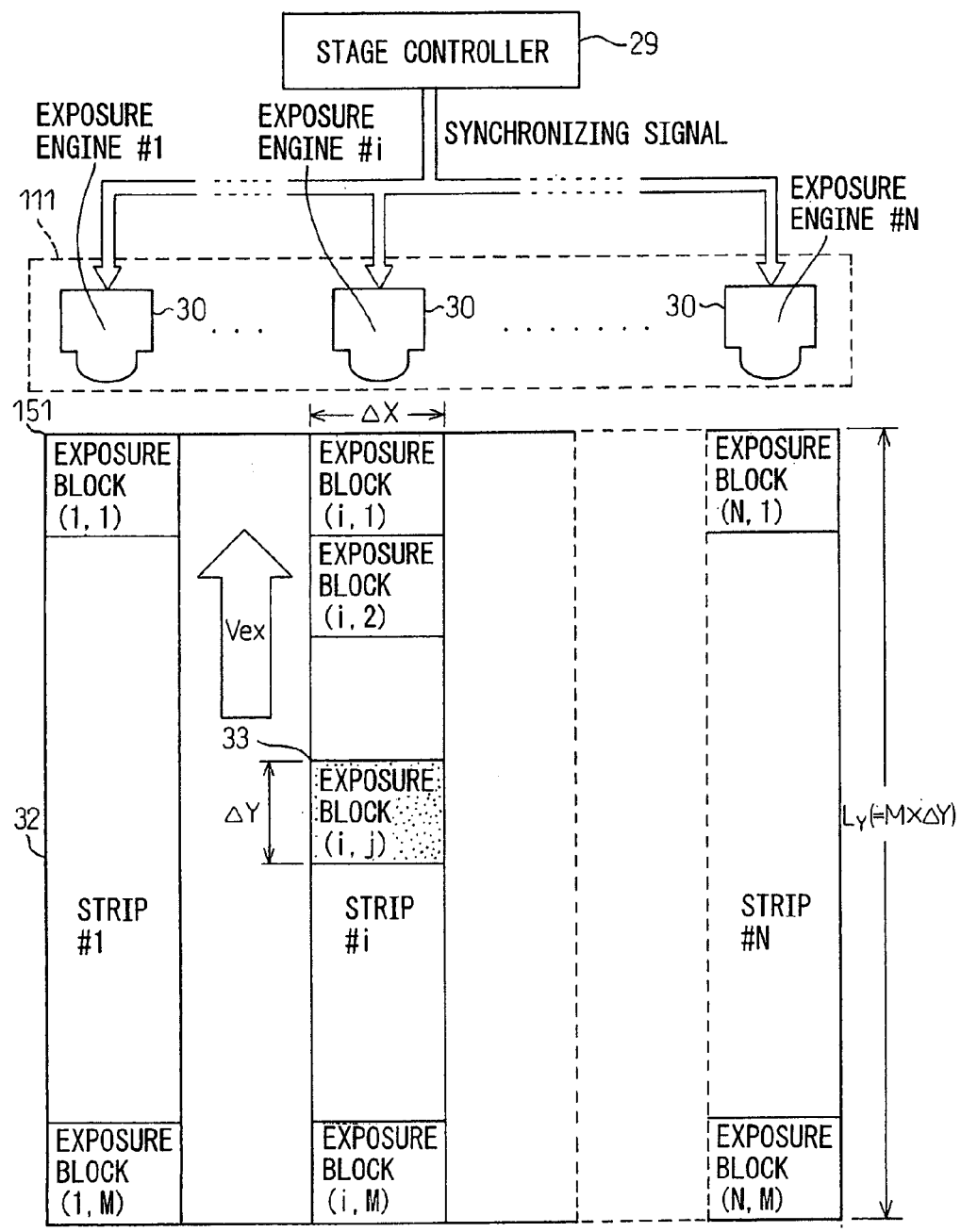
FIG. 12 is a diagram showing the operating principle of the conventional direct exposure apparatus.
Figure 13:
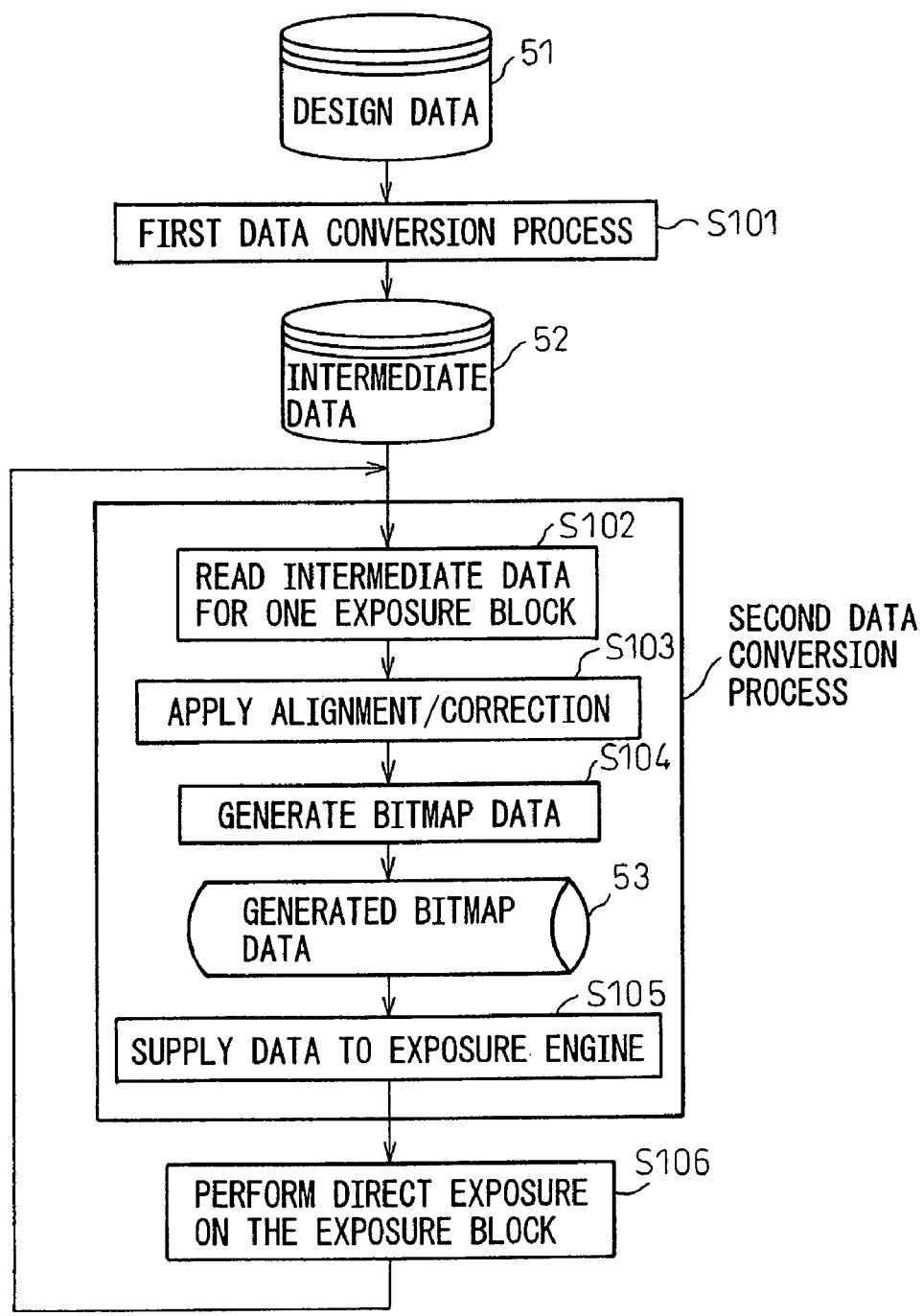
FIG. 13 is a flowchart showing the data processing flow in the conventional direct exposure apparatus.
Figure 14:
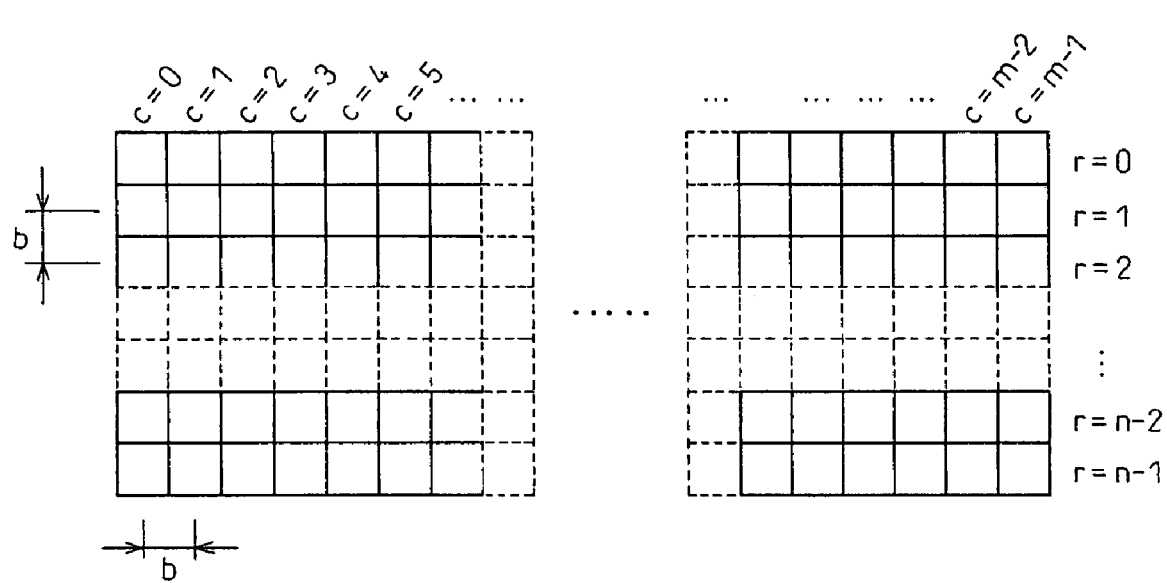
FIG. 14 is a schematic diagram illustrating the concept of the exposure data of bitmap form used in a direct exposure process by the conventional direct exposure apparatus.
Figure 15:
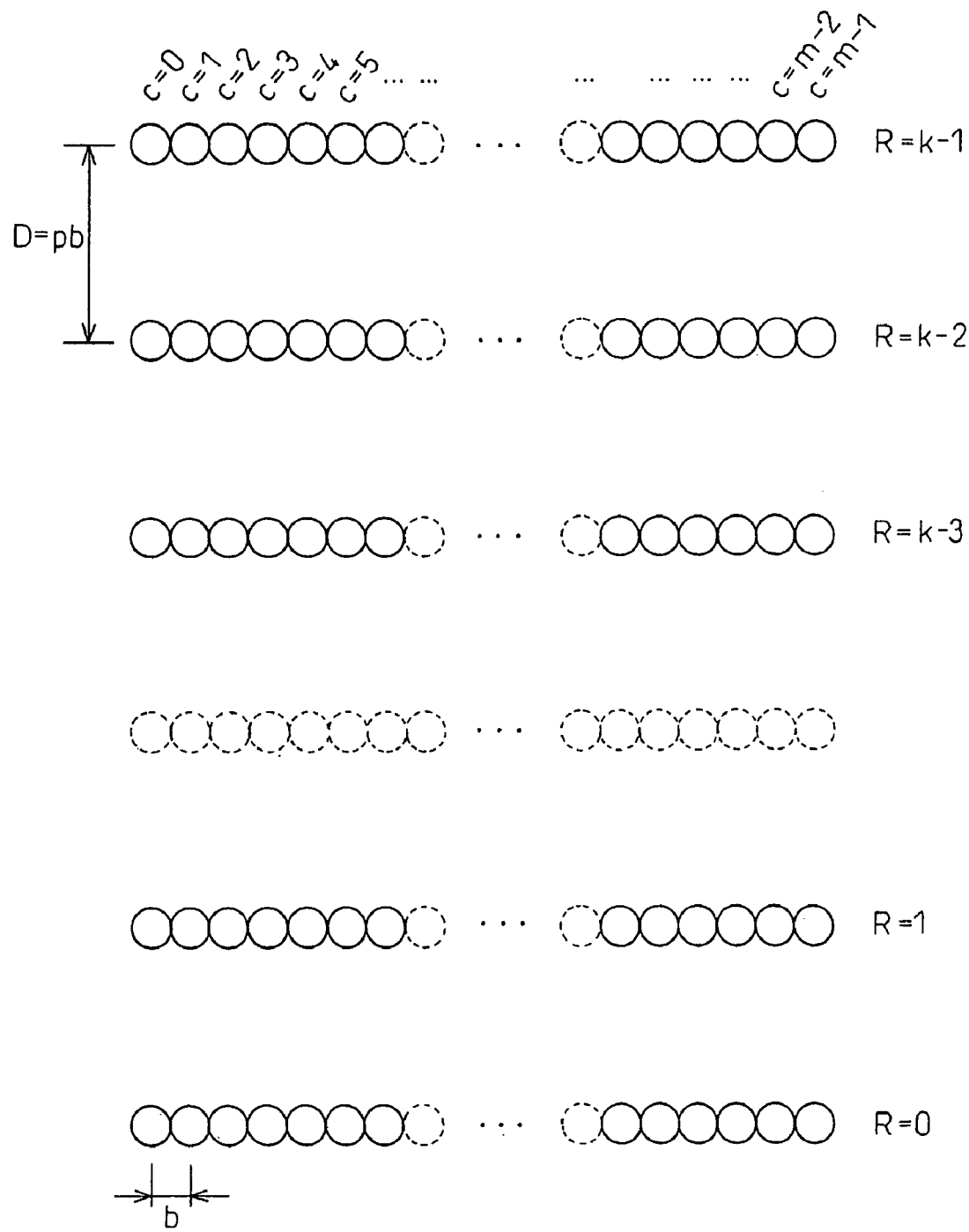
FIG. 15 is a schematic diagram illustrating the arrangement of light sources in one exposure engine that performs the direct exposure using the exposure data shown in FIG. 14.
Figure 16A:
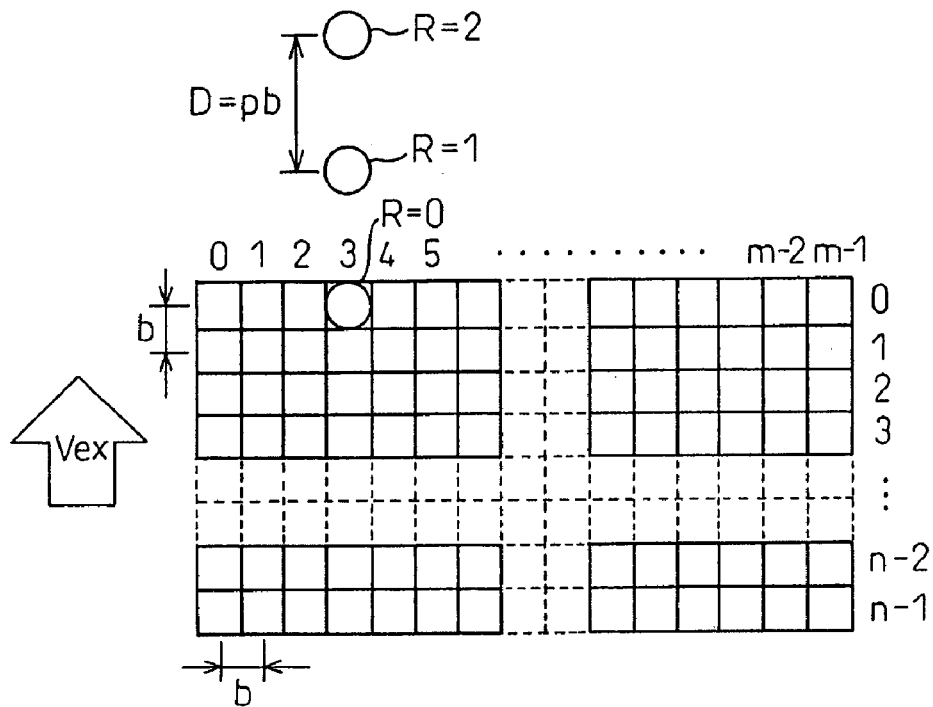
FIGS. 16A and 16B are schematic diagrams (part 1) for explaining the relationship between the bitmap data shown in FIG. 14 and the light source arrangement in the exposure engine shown in FIG. 15.
Figure 16B:
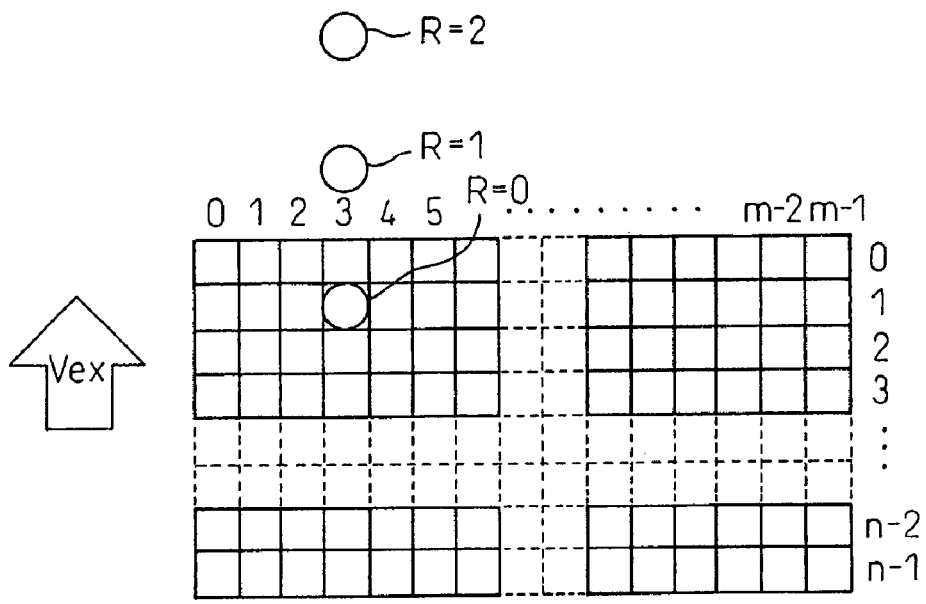
Figure 17A:
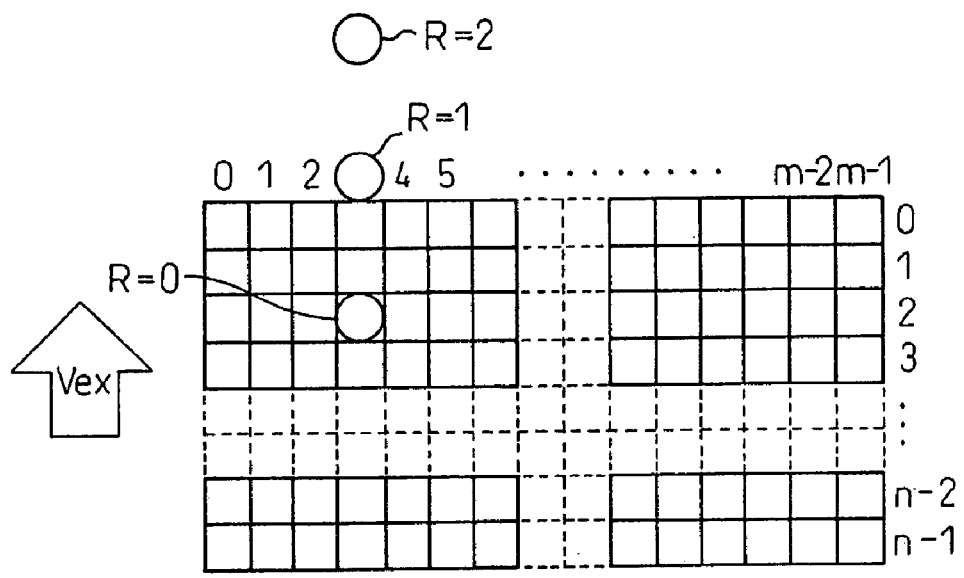
FIGS. 17A and 17B are schematic diagrams (part 2) for explaining the relationship between the bitmap data shown in FIG. 14 and the light source arrangement in the exposure engine shown in FIG. 15.
Figure 17B:
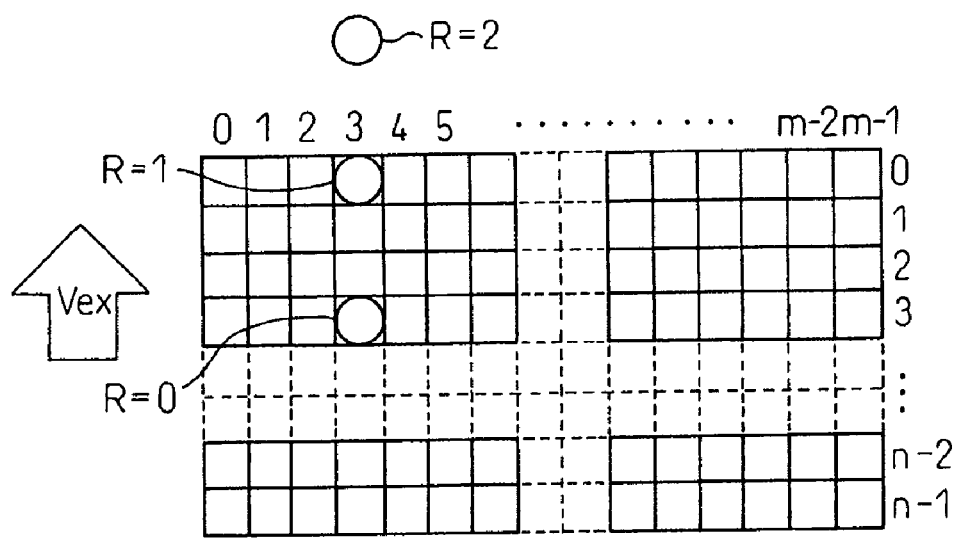

In the modified example, a determination has been made in step S301 as to whether the two processes, i.e., the process for storing the DMD frame data for the current frame in the storage means and the duplication process of the DMD data for the previous frame, have been completed or not, but instead of performing the step S301, a determination may be made as to whether the synchronizing signal that the stage controller 29, previously described with reference to FIG. 12, supplies to each of the exposure engines #1 to #N (reference numeral 30) has been received or not. In this case, one cycle of the synchronizing signal should be made to provide the time at least sufficient to complete the two processes, i.e., the process for storing the DMD frame data for the current frame in the storage means and the duplication process of the DMD data for the previous frame.

In the above embodiment and the modified example, the DMD frame data (exposure data) for one exposure device group has been duplicated by way of the storage means 15 to generate the same DMD frame data to be supplied to the respective exposure device groups. This is because the data supplying means 11 and the exposure engine 30 are interconnected by a serial bus and, using this serial bus, the DMD frame data is supplied from the data supplying means 11 to the exposure engine 30. Alternatively, the data supplying means 11 and the exposure engine 30 may be interconnected by a plurality of distribution buses so that the DMD frame data generated by the data generating means may be supplied directly to the work memory areas corresponding to the respective exposure device groups of the DMD in the exposure engine 30.

Next, a description will be given of the computer simulation conducted by actually inserting numeric values into the embodiment of the present invention.

As is known in the prior art, in order to achieve exposure of an array of illumination spots arranged at smaller spacing than the spacing of the exposure devices, it is practiced to move the exposure target substrate by tilting it by an angle θ relative to the array of the exposure devices arranged in a plurality of rows and columns. First, this will be explained briefly below.

Figure 8:
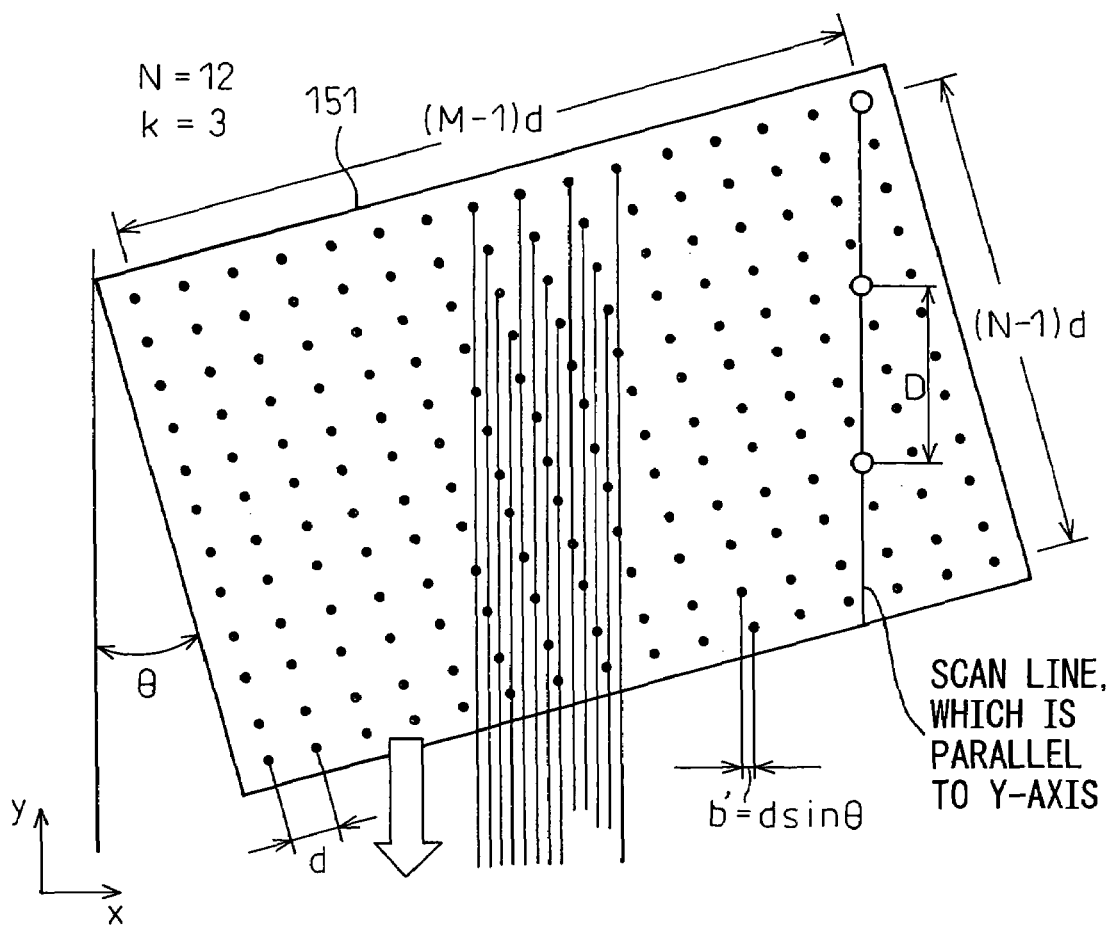
FIG. 8 is a diagram for explaining the positional relationship between an exposure target substrate and exposure devices arrayed in a plurality of rows and columns.
Figure 11:
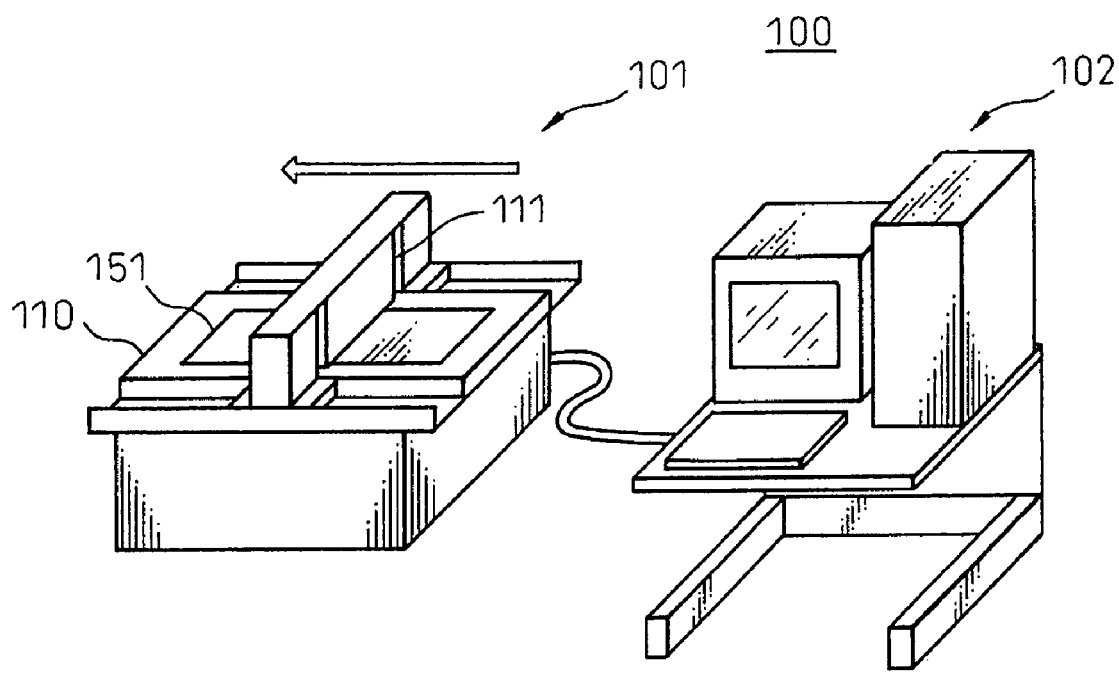
FIG. 11 is a diagram schematically showing a conventional direct exposure system.

FIG. 8 is a diagram for explaining the positional relationship between the exposure target substrate and the exposure devices arrayed in a plurality of rows and columns. As shown, xy coordinates are set; open circles each indicate the area that one exposure device on a scan line can illuminate, and solid circles indicate the illumination spots to be illuminated by the exposure devices. It is assumed that the number of exposure devices on a scan line is k, while the number of illumination spots is N×M (where N and M are integers). Further, the spacing of the exposure devices on a scan line is denoted by D, while the spacing of the illumination spots, that is, the target resolution (i.e., the resolution of the bitmap data), is denoted by d (where d<D). The size of the exposure target area on the exposure target substrate 151 is (N−1)×d vertically and (M−1)×d horizontally. The ON/OFF switching speed of the exposure devices, that is, the angular switching rate of the DMD micromirrors (i.e., the modulation rate of the DMD), is taken as the frame rate f.

In order to achieve exposure of the array of the illumination spots arranged at larger spacing d than the diameter of the open circle that one exposure device can illuminate, the image of DMD is tilted by an angle θ in the negative direction of the y axis in the figure. That is, when the exposure target substrate 151 is tilted by the angle θ, any one of the plurality of areas (open circles) illuminated by the exposure devices passes over one of the illumination spots (solid circles).

In FIG. 8, when the resolution on the DMD is denoted by b', and the DMD micromirror spacing by d (a constant), the following equation (1) holds.

$$b' = d \sin\theta \quad (1)$$

Likewise, in FIG. 8, the following equation (2) holds.

$$\sin\theta = \frac{kd \cos\theta - b'}{(N-1)d} \quad (2)$$

Substituting the equation (1) into the equation (2) and modifying the result, the following equation (3) is obtained.

$$\sin\theta = \frac{kd \cos\theta - b'}{(N-1)d} \quad (3)$$
$$= \frac{kd \cos\theta - d \sin\theta}{(N-1)d}$$
$$= \frac{k \cos\theta - \sin\theta}{N-1}$$

Dividing both sides of the equation (3) by sin θ and modifying the result, the following equation (4) is obtained.

$$\tan\theta = \frac{k}{N} \quad (4)$$

Accordingly, if the exposure target substrate is tilted by the angle θ that satisfies the equation (4), and moved relative to the array of the plurality of exposure devices, then the illumination spots arrayed at a smaller spacing b (on the exposure surface) than the spacing d can be exposed to light by using the exposure devices arrayed at spacing d.

Here, generally b≠b'; therefore, the optics 12 having a combined magnification U are inserted between the DMD of the exposure engine 30 and the exposure target substrate 151, to satisfy the following equation (5).

$$b = Ub' \quad (5)$$

$$U = \frac{b}{b'} \quad (6)$$
$$= \frac{b}{d \sin\theta}$$

$$= \frac{b}{\frac{b}{d}\sqrt{1 + \left(\frac{N}{k}\right)^2}}$$

The simulation was conducted assuming the use of the DMD of SXGA type (1280×1024 pixels, i.e., the micromirrors arranged in n=1024 rows and m=1280 columns), and the following calculations were performed with various parameters for the case where the exposure devices were not divided into groups, that is, the present invention was not applied, and for the case where the exposure devices were divided into groups according to the present invention. That is, all the combinations of (n, k) that satisfy the following three conditions were calculated: the condition that "n can take any integer value between 1 to 1024," the condition that "k can take any integer value between 1 to 1024," and the condition that "k divides into n." Here, it can be understood that the condition that "k divides into n" is based on the relationship between the bitmap data and the exposure devices (light sources) previously explained with reference to FIGS. 16A, 16B, 17A, and 17B. Once the combinations of (n, k) that satisfy all the above conditions are determined, the angle θ can be calculated from the equation (4). Further, the combined magnification U can be calculated from the equation (6).

FIG. 9 is a diagram showing the result of the computer simulation (simulation example 1) according to the embodiment of the present invention. In this simulation example 1, the target resolution b on the exposure surface was set to 1 μm.

When the present invention is not applied, the number, n, of pixel rows in the DMD frame data is 1000, and the number, k, of exposure devices arranged in the exposure device array in the direction of the relative movement of the exposure target substrate is 20; on the other hand, when the exposure devices are divided into three groups by applying the present invention, the number, n', of pixel rows in the DMD frame data for one sub-screen is 300, and the number, k, of exposure devices in each exposure device group is 6. In the present invention, as the three sub-screens are superimposed one on top of another by using the optics, the light energy illuminating the exposure target substrate is three times the light energy that one exposure device group can produce. That is, the number, k, of exposure devices contributing to the exposure is equivalently 18 (=6×3).

FIG. 10 is a diagram showing the result of the computer simulation (simulation example 2) according to the embodiment of the present invention. In this simulation example 2, the target resolution b on the exposure surface was set to 0.5 μm.

When the present invention is not applied, the number, n, of pixel rows in the DMD frame data is 960, and the number, k, of exposure devices arranged in the exposure device array in the direction of the relative movement of the exposure target substrate is 24; on the other hand, when the exposure devices are divided into two groups by applying the present invention, the number, n', of pixel rows in the DMD frame data for one sub-screen is 480, and the number, k, of exposure devices in each exposure device group is 12. In the present invention, as the two sub-screens are superimposed one on top of the other by using the optics, the light energy illuminating the exposure target substrate is twice the light energy that one exposure device group can produce. That is, the number, k, of exposure devices contributing to the exposure is equivalently 24 (=12×2).

The above simulation results show that even when the exposure devices are divided into groups according to the present invention, the light energy necessary to accomplish the exposure, i.e., the amount of light energy substantially the same as that obtained in the prior art to which the present invention is not applied, can be secured. Furthermore, as the number of pixel rows in the DMD frame data can be greatly reduced according to the present invention, the processing speed can be greatly increased compared with the prior art.

In the above embodiment and the modified example, the exposure apparatus has been described as using the DMD for the exposure engine, but using the DMD itself does not restrict the present invention; for example, the invention may be embodied using a liquid crystal device having a function equivalent to that of the DMD.

The present invention can be applied to an exposure apparatus in which exposure data necessary for direct exposure is sequentially supplied to an exposure engine having a plurality of exposure devices and, based on the thus supplied exposure data, the exposure engine forms an exposure pattern on an exposure target substrate moving relative to the exposure engine.

According to the present invention, the same exposure data is supplied to each of the exposure device groups formed by dividing the plurality of exposure devices in the exposure engine into groups, and the lights produced from the respective exposure device groups are projected so as to be superimposed one on top of another on the same area on the exposure target substrate; accordingly, the processing speed of direct exposure can be enhanced, while securing the light energy necessary to expose the photoresist without increasing the output level of the existing light sources. Further, most of the exposure devices in the exposure engine can be effectively utilized. The present invention can be applied not only to the exposure process for forming a wiring pattern on a wiring substrate but also to various other product fabrication processes, such as an exposure process for forming windows to a solder resist layer or an insulating layer on a wiring substrate and an exposure process for forming a rewiring layer on a wafer level package.

According to the patterning method based on the direct exposure, high-precision wiring formation can be accomplished, easily and at high speed, and the wiring density can be increased. Accordingly, the method is best suited to applications where complicated wiring patterns that require particularly high precision are formed by direct exposure, and can easily address a future need for superfine wiring and the resulting increase in the amount of exposure data. Furthermore, the reduction in the number of exposure engines can also be easily accomplished by increasing the amount of data in the exposure data corresponding to the direction perpendicular to the direction of the relative movement of the exposure target substrate.

What is claimed is:

1. An exposure apparatus in which exposure data necessary for direct exposure is sequentially supplied to an exposure engine having a plurality of exposure devices and, based on said exposure data, said exposure engine forms an exposure pattern on an exposure target moving relative to said exposure engine, said exposure apparatus comprising:

data supplying means for supplying the identical exposure data to each of a plurality of exposure device groups formed by dividing said plurality of exposure devices in said exposure engine into groups; and optics via which lights respectively produced from said exposure device groups based on said exposure data supplied from said data supplying means are projected so as to be wholly superimposed one on top of another on the same area on said exposure target.

2. An exposure apparatus as claimed in claim 1, wherein said exposure device groups are formed by dividing said plurality of exposure devices arranged in a two-dimensional array into groups along a direction perpendicular to the direction of relative movement of said exposure target.

3. An exposure apparatus in which exposure data necessary for direct exposure is sequentially supplied to an exposure engine having a plurality of exposure devices and, based on said exposure data, said exposure engine forms an exposure pattern on an exposure target moving relative to said exposure engine, said exposure apparatus comprising:

data generating means for generating exposure data for one of a plurality of exposure device groups formed by dividing said plurality of exposure devices in said exposure engine into groups;

data duplicating means for creating as many sets of said exposure data generated by said data generating means as the number of said exposure device groups minus one; and optics via which lights respectively produced from said exposure device groups, based on said exposure data supplied from said data generating means and said exposure data supplied from said data duplicating means, are projected so as to be wholly superimposed one on top of another on the same area on said exposure target.

4. An exposure apparatus as claimed in claim 3, further comprising at least two storage means for storing said exposure data generated by said data generating means, and wherein while said data duplicating means is performing processing for duplicating said exposure data stored in one of said storage means, said data generating means generates new exposure data corresponding to said one exposure device group and stores said new exposure data in the other one of said storage means.

5. An exposure apparatus as claimed in claim 3, wherein said exposure device groups are formed by dividing said plurality of exposure devices arranged in a two-dimensional array into groups along a direction perpendicular to the direction of relative movement of said exposure target.

6. An exposure method in which exposure data necessary for direct exposure is sequentially supplied to an exposure engine having a plurality of exposure devices and, based on said exposure data, said exposure engine forms an exposure pattern on an expo sure target moving relative to said exposure engine, wherein said plurality of exposure devices in said exposure engine are divided into a plurality of exposure device groups, and lights respectively produced from said exposure device groups based on the identical exposure data are projected via optics so as to be wholly superimposed one on top of another on the same area on said exposure target.

7. An exposure method as claimed in claim 6, wherein said exposure device groups are formed by dividing said plurality of exposure devices arranged in a two-dimensional array into groups along a direction perpendicular to the direction of relative movement of said exposure target.

8. An exposure method in which exposure data necessary for direct exposure is sequentially supplied to an exposure engine having a plurality of exposure devices and, based on said exposure data, said exposure engine forms an exposure pattern on an exposure target moving relative to said exposure engine, said exposure methods comprising:

a first step for generating exposure data corresponding to one of a plurality of exposure device groups, wherein said plurality of exposure devices in said exposure engine are divided into a plurality of exposure device groups, and for creating as many sets of said exposure data generated by said data generating means as the number of said exposure device groups minus one; and a second step for causing lights, respectively produced from said exposure device groups based on said exposure data respectively supplied to said exposure device groups, to be projected via optics so as to be wholly superimposed one on top of another on the same area on said exposure target.

9. exposure method as claimed in claim 8, wherein said first step performs processing for generating new exposure data corresponding to said one exposure device group while performing processing for creating as many duplicates of said exposure data as there are exposure device groups excluding said one exposure device group.

10. exposure method as claimed in claim 8, wherein said exposure device groups are formed by dividing said plurality of exposure devices arranged in a two-dimensional array into groups along a direction perpendicular to the direction of relative movement of said exposure target.

* * * * *